(12) United States Patent
Muramatsu et al.

(10) Patent No.: US 8,920,924 B2
(45) Date of Patent: Dec. 30, 2014

(54) METHOD FOR PRODUCING ALKALI METAL NIOBATE PARTICLES, AND ALKALI METAL NIOBATE PARTICLES

(75) Inventors: Atsushi Muramatsu, Sendai (JP); Kiyoshi Kanie, Sendai (JP); Atsuki Terabe, Iwaki (JP); Yasuhiro Okamoto, Iwaki (JP); Hideto Mizutani, Iwaki (JP); Satoru Sueda, Iwaki (JP); Hirofumi Takahashi, Fuji (JP)

(73) Assignees: Sakai Chemical Industry Co., Ltd., Osaka (JP); TOHOKU University, Miyagi (JP); Fuji Ceramics Corporation, Shizuoka (JP)

( * ) Notice: Subject to any disclaimer, the term of this patent is extended or adjusted under 35 U.S.C. 154(b) by 269 days.

(21) Appl. No.: 13/262,788

(22) PCT Filed: Apr. 5, 2010

(86) PCT No.: PCT/JP2010/056175
§ 371 (c)(1),
(2), (4) Date: Dec. 12, 2011

(87) PCT Pub. No.: WO2010/116975
PCT Pub. Date: Oct. 14, 2010

(65) Prior Publication Data
US 2012/0094126 A1 Apr. 19, 2012

(30) Foreign Application Priority Data
Apr. 9, 2009 (JP) .................................. 2009-095014

(51) Int. Cl.
*B32B 5/16* (2006.01)
*C01G 33/00* (2006.01)
*H01L 41/187* (2006.01)
*C04B 35/495* (2006.01)
*H01L 41/317* (2013.01)

(52) U.S. Cl.
CPC .......... *H01L 41/1873* (2013.01); *C04B 35/495* (2013.01); *C01G 33/006* (2013.01);
(Continued)

(58) Field of Classification Search
CPC ................ C04B 35/495; C04B 35/622; C04B 35/62675; C04B 2235/3201; C04B 2235/3255; C01P 2004/38; C01P 2004/32; C01P 2004/54; C01P 2004/61; C01G 33/006; C01D 1/02
USPC ........................ 423/62, 65, 179, 184; 501/134
See application file for complete search history.

(56) References Cited

U.S. PATENT DOCUMENTS 2,758,088 A * 8/1956 Cottle et al. .................. 508/570
3,366,570 A * 1/1968 Willem ......................... 510/298
(Continued)

FOREIGN PATENT DOCUMENTS

| CN | 101062864 | 10/2007 |
|---|---|---|
| CN | 101186501 | 5/2008 |

(Continued)

OTHER PUBLICATIONS

Amini and Mirzaee, Effect of solvent and temperature on the preparation of potassium niobate by hydrothermal-assisted sol-gel processing, Ceramics International, 35 (2009) 2367-2372.*

(Continued)

*Primary Examiner* — Holly Le
(74) *Attorney, Agent, or Firm* — Hamre, Schumann, Mueller & Larson, P.C.

(57) ABSTRACT

Disclosed are a method of producing fine particulate alkali metal niobate in a liquid phase system, wherein the size and shape of particles of the fine particulate alkali metal niobate can be controlled; and fine particulate alkali metal niobate having a controlled shape and size. Specifically disclosed are a method of producing particulate sodium-potassium niobate represented by the formula (1): $Na_xK_{(1-x)}NbO_3$ (1), the method including four specific steps, wherein a high-concentration alkaline solution containing $Na^+$ ion and $K^+$ ion is used as an alkaline solution; and particulate sodium-potassium niobate having a controlled shape and size.

8 Claims, 9 Drawing Sheets

(52) U.S. Cl.
CPC ....... *H01L 41/317* (2013.01); *C04B 2235/3201* (2013.01); *C04B 2235/3255* (2013.01); *C04B 2235/52* (2013.01); *C01P 2002/72* (2013.01); *C01P 2002/85* (2013.01); *C01P 2004/03* (2013.01); *C01P 2004/41* (2013.01); *C01P 2004/54* (2013.01); *C01P 2004/61* (2013.01); *C01P 2004/62* (2013.01)
USPC ............... 428/402; 423/62; 423/65; 423/179; 423/594.8; 423/594.15; 501/34

(56) References Cited

U.S. PATENT DOCUMENTS

| | | | | |
|---|---|---|---|---|
| 5,229,101 | A | * | 7/1993 | Watanabe et al. ............. 423/598 |
| 6,692,652 | B2 | * | 2/2004 | Takao et al. ............... 252/62.9 R |
| 7,560,089 | B2 | * | 7/2009 | Takao et al. ................ 423/594.7 |
| 8,124,047 | B2 | * | 2/2012 | Kaigawa et al. ........... 423/594.8 |
| 2004/0120881 | A1 | * | 6/2004 | Takao et al. ................ 423/594.7 |
| 2006/0006360 | A1 | * | 1/2006 | Takao et al. ............... 252/62.9 R |
| 2006/0091588 | A1 | * | 5/2006 | Nakamura et al. ............ 264/672 |
| 2009/0177049 | A1 | * | 7/2009 | Eriksson et al. .............. 600/301 |
| 2009/0324954 | A1 | * | 12/2009 | Nakajima ..................... 428/402 |
| 2012/0064344 | A1 | * | 3/2012 | Muramatsu et al. .......... 428/402 |
| 2014/0103246 | A1 | * | 4/2014 | Muramatsu et al. ..... 252/62.9 R |

FOREIGN PATENT DOCUMENTS

| | | |
|---|---|---|
| CN | 101323522 | 12/2008 |
| JP | 60-052098 | 3/1985 |
| JP | 2000-313664 | 11/2000 |
| JP | 2005-272266 | 10/2005 |
| WO | WO 2006/045169 | 5/2006 |

OTHER PUBLICATIONS

Sun, et al., "Hydrothermal Synthesis of Single Crystalline (K, Na) $NbO_3$ Powders", Eur. J. Inorg. Chem., 2007, pp. 1884-1888.

Saito, et al., "Synthesis of polycrystalline platelike $KNbO_3$ particles by the topochemical micro-crystal conversion method and fabrication of grain-oriented $(K_{0.5}Na_{0.5})NbO_3$ ceramics", Journal of the European Ceramic Society 27, 2007, pp. 4085-4092.

Academic Dissertation of Wanfang Database, Apr. 28, 2008, pp. 37-38, 41-44, 47, and 50-51.

Wang et al., "Hydrothermal synthesis of potassium niobate powders", Ceramics International, 2007, vol. 33, pp. 1611-1615.

\* cited by examiner

Cl-NK1 (Na:K=6:12)

Cl-NK2 (Na:K=5:13)

Simple quantitative analysis result

| Element | Atomic concentration(%) |
|---------|-------------------------|
| O | 68.09 |
| Na | 3.37 |
| K | 11.93 |
| Nb | 16.61 |

Nb / Na / K = 1 / 0.20 / 0.72

US 8,920,924 B2

METHOD FOR PRODUCING ALKALI METAL NIOBATE PARTICLES, AND ALKALI METAL NIOBATE PARTICLES

TECHNICAL FIELD

The present invention relates to a method of producing particulate alkali metal niobate, and particulate alkali metal niobate.

BACKGROUND OF THE INVENTION

Piezoelectric ceramics have significantly contributed to downsizing and sophistication of electronic devices. In addition to applications to conventional devices such as sensors or ultrasonic transducers, piezoelectric ceramics are recently used, for example, as a raw material of transformers for LCD backlights of personal computers or a raw material of head parts of ink jet printers.

Lead-based materials such as PZT-based materials prevail nowadays as such piezoelectric ceramic devices. However, lead-based materials contain large amounts of harmful lead oxide, and thus, for example, environmental pollution by spilled lead oxide on disposal has been a matter of concern. Therefore, development has been strongly demanded for lead-free piezoelectric ceramic materials which can be used for alternatives to conventional lead based materials.

Recently, alkali niobate piezoelectric ceramics draw attention as lead-free ceramic materials, which exhibit relatively high piezoelectricity. Patent Document 1, for example, proposes a piezoelectric ceramic including a solid solution mainly composed of lithium sodium niobate, together with minor components as aluminum oxide and iron oxide. Patent Document 2 proposes an improved composition for a piezoelectric ceramic, which includes potassium niobate and sodium niobate, as main components, and copper, lithium, and tantalum, as additional components.

As a method of producing such piezoelectric ceramics, a method called a solid phase method has been widely known. The solid phase method typically includes mechanically mixing or kneading plural kinds of particulate materials as raw materials, then pelletizing, and calcining the obtained pellets.

In recent years, liquid phase methods of synthesizing $NaNbO_3$ particles have also been studied. For example, Non-Patent Document 1 reports a method of synthesizing $NaNbO_3$ particles by reacting NaOH or KOH solution with $Nb_2O_5$ particles.

Another technique has been recently reported on a method for producing particulate $KNbO_3$ by once synthesizing layered $K_4Nb_6O_{17}$ particles, and then heating the particles at a high temperature in a molten salt (Non-Patent Document 2).

PRIOR ART DOCUMENTS

Patent Documents

[Patent Document 1] JP 60-52098 B
[Patent Document 2] JP 2000-313664 A

Non-Patent Document

[Non-Patent Document 1] C. Sun et al., European Journal of Inorganic Chemistry, 2007, 1884
[Non-Patent Document 2] Y. Saito et al., Journal of the European Ceramic Society, 27 (2007) 4085

SUMMARY OF THE INVENTION

Problem to be Solved by the Invention

However, solid phase methods are disadvantageous in that nanoscale uniform mixing of raw material particles is generally difficult because commonly available raw material particles often have a larger size, like about several millimeters to several micrometers. When raw material particles are calcined at a high temperature, the original crystal structure of the raw material changes into perovskite crystal structure. Thus, it is difficult to precisely control crystallite size and grain boundaries in a solid phase method. Control of grain boundaries is especially indispensable for enhancing properties of piezoelectric ceramics because grain boundaries significantly affect some properties such as piezoelectric properties or strength. Therefore, use of a material in which control of grain boundaries are insufficient may lead to problems such as defects of products and deterioration of properties.

Conventional liquid phase methods may cause particle agglomeration. Also, it is generally difficult to control the size and shape of particles in a uniform state by a conventional liquid phase method. For example, particles produced by the method described in Patent Document 1 are given as aggregates, and are not suitable as a material to form piezoelectric devices, for which downsizing has been recently demanded.

The method described in Patent Document 2 also requires some improvement in that control of the particle size is actually impossible or that multi-step synthesis is required.

In view of the current state, there has been a demand for developing a method of producing particulate alkali metal niobate, which is suitable for mass production, can prevent agglomeration of particles, and can control the grain boundaries and particle size. Further, there has been a demand for fine particulate alkali metal niobate having a highly uniform particle size.

Means for Solving the Problem

The present invention has an object to provide a liquid phase method of producing fine particulate alkali metal niobate which can control the size and shape of the fine particulate alkali metal niobate.

The inventors of the present invention have found that combination of sodium and potassium, among alkaline metals, at a specific ratio enables production of particulate sodium-potassium niobate consisting of secondary particles having a uniform size and a unique shape in a well reproducible manner. Thereby, the present inventors have completed the present invention.

Namely, a first aspect of the present invention relates to a method of producing particulate sodium-potassium niobate represented by the formula (1):

$$Na_xK_{(1-x)}NbO_3 \quad (1),$$

including the steps of:
(a) mixing a niobium-containing solution with an alkaline solution having a concentration of 0.1 to 30 mol/L, to prepare a suspension;
(b) still standing the suspension at between 80° C. and 150° C. for 12 to 48 hours;
(c) performing solvothermal reaction of the suspension at between 150° C. and 300° C. for 1 to 12 hours; and
(d) separating the particulate sodium-potassium niobate from a reaction mixture
wherein the alkaline solution contains $Na^+$ ion and $K^+$ ion.

In a preferred embodiment, a molar ratio between the Na$^+$ ion and the K$^+$ ion, Na:K, is from 1:17 to 17:1.

In another preferred embodiment, the niobium-containing solution includes:
- niobium oxide and/or niobium halide;
- a solvent selected from the group consisting of water, ethylene glycol, and polyethylene glycol; and
- an acid.

A second aspect of the present invention relates to particulate sodium-potassium niobate represented by the formula (1):

$$Na_xK_{(1-x)}NbO_3 \quad (1)$$

wherein each particle of the particulate sodium-potassium niobate has a maximum diameter of 0.05 to 20 µm and an aspect ratio of 1 to 5.

In a preferred embodiment, the x is in the range of $0.05 \leq x \leq 0.8$.

In another preferred embodiment, a cross-sectional plane of each particle of the particulate sodium-potassium niobate parallel to the longitudinal axis, the plane including the longitudinal axis, is substantially line-symmetrical with respect to the longitudinal axis, the length from the longitudinal axis to the outline of the particle decreasing towards the end of the particle along the longitudinal axis, and a cross-sectional plane of the particle perpendicular to the longitudinal axis is in a cross shape.

In yet another preferred embodiment, a cross-sectional plane of each particle of the particulate sodium-potassium niobate parallel to the longitudinal axis, the plane including the longitudinal axis, is substantially line-symmetrical with respect to the longitudinal axis, the length from the longitudinal axis to the outline of the particle decreasing towards the end of the particle along the longitudinal axis, and a cross-sectional plane of the particle perpendicular to the longitudinal axis is in a substantially circle shape.

In yet another preferred embodiment, the particulate sodium-potassium niobate is produced by the aforementioned method.

A third aspect of the present invention relates to a piezoelectric ceramic material that comprises the particulate sodium-potassium niobate.

Effect of the Invention

According to the production method of the present invention, secondary particles of particulate sodium-potassium niobate can be synthesized in a large scale while controlling the size and shape. Moreover, the shape and size of the particles can be freely controlled by adjusting the ratio of the sodium and potassium. The method of the present invention is advantageous because the method gives submicron to several micrometer particles, which are practically favorable as piezoelectric elements, in a manner suitable for mass production.

In addition, ceramic materials obtained by pelletizing the niobate particles and calcining the resultant pellet are advantageous than niobium-based piezoelectric ceramic materials obtained by conventional solid phase methods, in the following points:
1. Low-temperature calcination is practicable;
2. Excellent piezoelectric properties will be exhibited;
3. Densification of ceramic materials are easily achievable; and
4. Slurry preparation prior to production of layered articles is easy.

MODE FOR CARRYING OUT THE INVENTION

Figure 1:
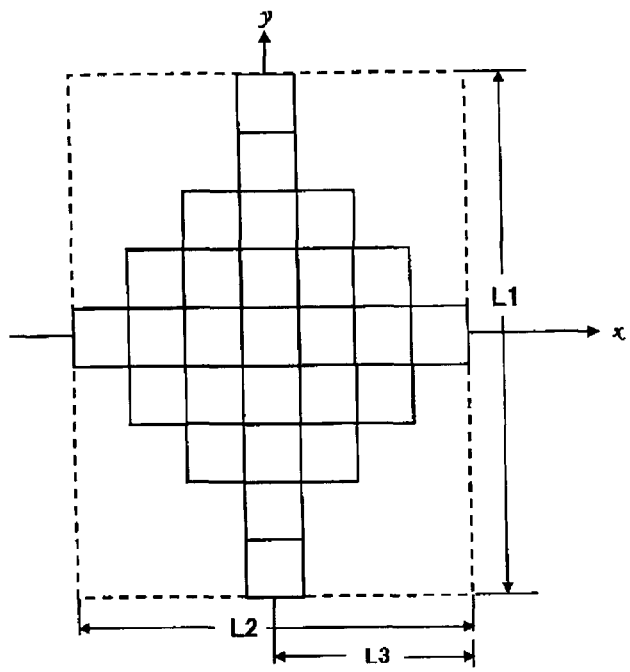
FIG. 1 illustrates a schematic diagram of a cross-section (cross-section in the xy-plane) parallel to the longitudinal axis of particulate sodium-potassium niobate which is a first aspect of the present invention.

The present invention will be explained in detail below.
<Method of Producing Particulate Sodium-Potassium Niobate>

As mentioned above, a first aspect of the present invention relates to a method of producing particulate sodium-potassium niobate represented by the formula (1):

$$Na_xK_{(1-x)}NbO_3 \quad (1)$$

including the steps of:
(a) mixing a niobium-containing solution with an alkaline solution having a concentration of 0.1 to 30 mol/L, to prepare a suspension;

(b) still standing the suspension at 80° C. to 150° C. for 12 to 48 hours;
(c) performing solvothermal reaction of the suspension at between 150° C. and 300° C. for 1 to 12 hours; and
(d) separating particulate sodium-potassium niobate from a reaction mixture,
wherein the alkaline solution contains $Na^+$ ion and $K^+$ ion.

In the following, each step is described.

The step (a) is for preparing a suspension by mixing a niobium-containing solution as a niobium source with a high-concentration alkaline solution.

The method to prepare a niobium-containing solution is not particularly limited. For example, such a solution can be prepared by dissolving a niobium compound in an acidic liquid solvent. Preferably, such a niobium compound may be, but not limited to, at least one selected from niobium oxide and niobium halides. Niobium oxide or niobium halide is more preferable. Examples of the niobium halides include niobium fluoride, niobium chloride, niobium bromide, and niobium iodide. In view of handleability and reactivity, niobium chloride is preferable among the niobium halide. Niobium compounds may be used alone or in combination of two or more of these.

Solvents to be contained in the above acidic liquid solvent are not particularly limited. Examples thereof include water, alcohols such as methyl alcohol and ethyl alcohol, and polyols such as ethylene glycol (EG), glycerol, and polyethylene glycol (PEG). Of these, water, ethylene glycol, and polyethylene glycol, as well as a mixture of these, are preferable in view of relatively high boiling points and applicability to solvothermal reaction. Water is particularly preferable.

The acid to be contained in the above acidic liquid solvent is not particularly limited. Examples thereof include inorganic acids such as hydrochloric acid, sulfuric acid, and nitric acid, and organic acids such as trifluoroacetic acid. Of these, hydrochloric acid and nitric acid are preferable in that they are easily removable after the reaction. Hydrochloric acid is particularly preferable.

Next, the alkaline solution to be used in the step (a) is described.

The alkaline solution according to the present invention includes both $Na^+$ ion and $K^+$ ion. Alkali compound to be contained in the alkaline solution are not particularly limited, and may be a mixture of KOH and NaOH. The mixture of KOH and NaOH is preferable because the mixture is favorable to prepare a high-concentration alkaline solution which is necessary for achieving the present invention.

The solvent to be contained in the alkaline solution is not particularly limited, and may be water, alcohol, diol, triol, and acetone. Of these, water is preferred.

The alkaline solution to be used in the present invention has such a high concentration as 0.1 to 30 mol/L. The concentration is equivalent to that of a very-high-concentration alkaline solution having a pH of about 13 or higher. That is, assuming that the degree of ionization of a strong base (such as NaOH and KOH) is 1 irrespective of the concentration of the alkaline solution, the pH of a "0.1 mol/L" alkaline solution corresponds to 13, as follows:

$[OH^-] = 1.0 \times 10^{-1}$ mol/L, $[H^+][OH^-] = 1.0 \times 10^{-14}$, and thus, $[H^+] = 1.0 \times 10^{-13}$, $pH = -\log[H^+] = 13$ An alkaline solution having a concentration of less than 0.1 mol/L is undesirable because particles may not grow sufficiently, and thus particles with a desired size and shape may not be produced. In contrast, if the concentration exceeds 30 mol/L, an alkaline solution usually reaches saturation. Thus, the upper limit of the concentration of the alkaline solution herein actually means a saturation concentration of the alkaline solution, and this upper limit may vary depending on the nature of the alkali. The lower limit of the concentration of the alkaline solution is preferably 1 mol/L, and more preferably 2 mol/L. The alkaline solution used herein is a fairly high concentration solution. Therefore, much attention is required to handle the solution. The reaction vessel for step (a) is preferably, but is not limited to, a corrosion-resistant vessel made of, for example, Teflon™.

The ratio of $Na^+$ ion relative to $K^+$ ion (Na:K) in the alkaline solution is preferably in the range of (1:17) to (17:1), and more preferably in the range of (4.5:13.5) to (6.5:12.5). Such specific ion ratio enables to provide secondary particles of particulate sodium-potassium niobate having unique shapes as mentioned below, such as substantially spheroidal particles like a rugby ball, or substantially octahedral particles (see FIGS. 5 to 8).

The niobium-containing solution and the alkali solution prepared separately in the above-mentioned manner are mixed together to prepare a suspension. The way of addition of the solutions is not particularly limited. For example, the niobium-containing solution may be added to the alkaline solution, or the alkaline solution may be added to the niobium-containing solution. In view of safety, it is preferable to slowly add a niobium-containing solution dropwise into the alkaline solution over a sufficient period of time. Temperature and pressure during the mixing are not particularly limited. Usually, the mixing may be carried out at an ordinary temperature (15° C. to 30° C.) under an ordinary pressure (about 1 atm).

Next, the step (b) is described.

The step (b) is a step of heating the suspension at a relatively low temperature over a long period of time. The method of the present invention is characterized by including two separate steps, namely, a step of heating the suspension at a relatively low temperature over a long period of time, and a step of performing solvothermal reaction at a high temperature for a short period of time. If the step (b) is omitted, aggregates are normally generated, so in many cases the particle size cannot be sufficiently controlled. Also, if the step (b) is omitted, it may be in many cases hard to provide particles having a substantially spheroidal or substantially octahedral shape, which impairs the characteristics of the present invention.

In the step (b), the suspension is heated to a temperature of 80° C. to 150° C. Keeping this temperature constant for a certain period of time can prevent the particles from aggregating, and encourages growth of the particles into a desired shape. The temperature is preferably 80° C. to 120° C., more preferably 90° C. to 110° C., and still more preferably the boiling point of a solvent. If water is used as the solvent, the suspension is preferably heated to 100° C.

The step (b) is characterized by allowing the suspension to still stand at a specific temperature for 12 to 48 hours. Such still standing step for a while can prevent the particles from aggregating, and promote growth of the particles into a desired shape. If the period for still standing is too short, the particles do not sufficiently grow. In contrast, if the period is too long, the effects may be saturated and the step is unfavorable from an economical viewpoint. Therefore, an appropriate period of still standing is 12 to 48 hours. The period of still standing is preferably 15 to 36 hours, more preferably 18 to 30 hours, and still more preferably 20 to 26 hours.

While the pressure during the step (b) is not particularly limited, the step is usually performed under an ordinary pressure (about 1 atm (=about 0.10 MPa)).

Next, the step (c) is described.

The step (c) is a step of subjecting the suspension having been heated at a relatively low temperature in the step (b) to solvothermal reaction at a high temperature.

The solvothermal reaction is a reaction performed under a moderate to high degree of pressure (normally 1 to 10,000 atm (=0.10 to 1,000 MPa)) and temperature (normally 100° C. to 1000° C.). When water is used as a solvent, the solvothermal reaction is specially referred to as "hydrothermal reaction". By performing this process, the particles can be stabilized and the shape of the particles can be controlled.

In the present invention, the solvothermal reaction is performed at a temperature of between 150° C. and 300° C. While not particularly limited, the temperature is preferably 150° C. to 250° C.

The period for the solvothermal reaction is not particularly limited, and is usually 1 to 12 hours, preferably 1 to 8 hours, and more preferably 2 to 5 hours.

The pressure in the solvothermal reaction is not particularly limited, and is usually 0.10 to 4.0 MPa.

Next, the step (d) is described.

The step (d) is a step to separate the particulate alkali metal niobate from the reaction product of the solvothermal reaction.

The method to separate the particulate alkali metal niobate is not particularly limited. Desired particulate alkali metal niobate can be separated through normal processes such as filtration, washing, and drying. The number of times of washing, solvents to be used for washing, and other conditions are not particularly limited, and may be appropriately selected.

<Particulate Sodium-Potassium Niobate>

Particulate alkali metal niobate, which is the second aspect of the present invention, is described. The particulate alkali metal niobate of the invention is particulate sodium-potassium niobate represented by the formula (1):

$$Na_xK_{(1-x)}NbO_3 \quad (1).$$

The maximum diameter of each of the particles is 0.05 to 20 μm, and the aspect ratio of each of the particles is 1 to 5.

The meanings of the "maximum diameter," "aspect ratio," and "longitudinal axis" used herein are described below with reference to drawings.

The "maximum diameter" is a distance between two points on the outline of the particle when the two points are taken in a manner that the distance is maximized. FIG. 1 shows a cross-section of a particle of the particulate sodium-potassium niobate according to a first aspect of the present invention. The particle is cut so that the cross-section includes the maximum diameter represented by L1. Here, an axis including a straight line, which corresponds to the maximum diameter connecting two points on the particle outline, is referred to as a "longitudinal axis." In FIG. 1, the longitudinal axis is a y-axis.

Assuming that the particle is surrounded by a rectangle (generally called a circumscribed rectangle), the ratio of the long side length to the short side length (long side/short side) of the smallest rectangle is referred to as an aspect ratio. In FIG. 1, the circumscribed rectangle is shown by a dashed line. The long side is parallel to the longitudinal axis (y-axis direction in FIG. 1), and the length of the long side is equal to the maximum diameter L1. The short side is perpendicular to the longitudinal axis (x-axis direction in FIG. 1), and the length is represented by L2 in FIG. 1. The length of the short side refers to the longest length among the particle diameters which are perpendicular to the longitudinal axis. In FIG. 1, the aspect ratio is represented by L1/L2.

In the present invention, the length of each of the particles in the longitudinal axis direction is 0.05 to 20 μm, preferably 0.5 to 10 μm, and more preferably 1 to 5 μm. The particle length in the longitudinal axis direction within the above range leads to highly uniform size and shape, which is advantageous when applied to a fine-shape molded body, or the like.

The aspect ratio of each of the particles is 1 to 5, preferably 1 to 3, and more preferably 1 to 2. For example, a typical particle shown at the center of FIG. 6 has an aspect ratio of 1 to 1.5.

Figure 5:
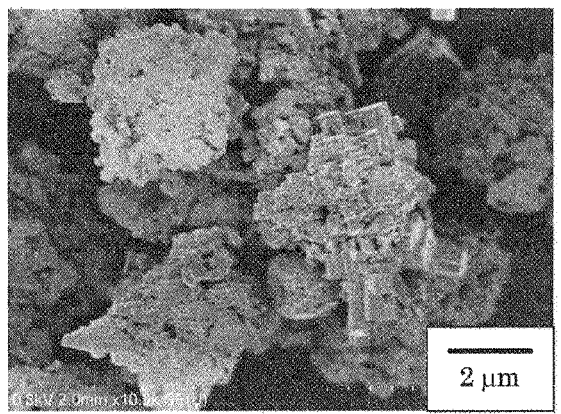
FIG. 5 shows a SEM image of particulate sodium-potassium niobate obtained when the ratio of Na:K was 6:12.
Figure 6:
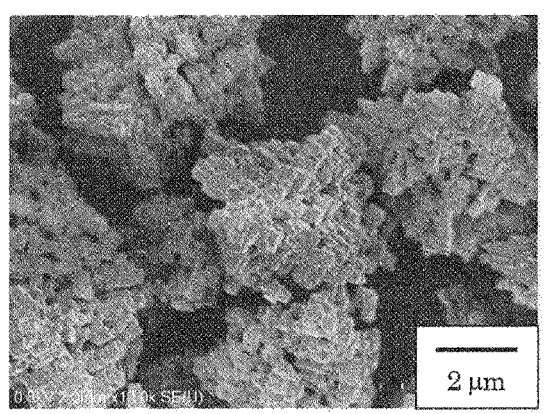
FIG. 6 shows a SEM image of particulate sodium-potassium niobate obtained when the ratio of Na:K was 5:13.

The particulate sodium-potassium niobate of the present invention has unique shapes such as rugby ball-like substantially spheroidal and substantially octahedral shapes (see FIGS. 5 and 6). In order to achieve such unique shapes, the x in the formula (1) is preferably in the range of 0.05≤x≤0.8, and more preferably in the range of 0.25≤x≤0.36.

Preferable embodiments of the present invention relate to the particulate sodium-potassium niobate having such unique shapes as mentioned earlier. Some of the preferable embodiments will be described below with reference to drawings.

Figure 2:
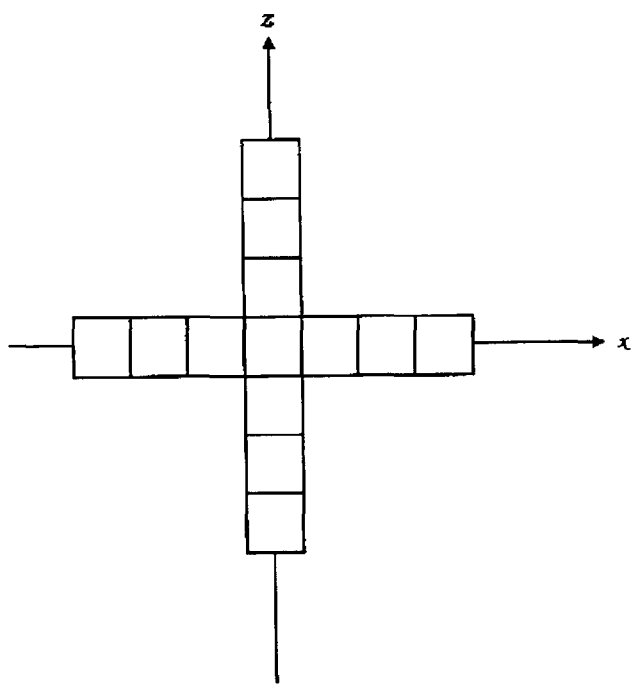
FIG. 2 illustrates a schematic diagram of a cross-section (cross-section in the xz-plane) cut perpendicular to the longitudinal axis of the particulate sodium-potassium niobate which is the first aspect of the present invention.

The schematic diagrams shown in FIGS. 1 and 2, and the SEM image shown in FIG. 6 relate to the particulate sodium-potassium niobate having an octahedral shape, which is one of the preferable embodiments of the present invention.

As mentioned earlier, FIG. 1 illustrates a schematic diagram of a cross-section (cross-section in the xy-plane) parallel to the longitudinal axis of the particle. FIG. 2 illustrates a schematic diagram of a cross-section (cross-section in the xz-plane) cut perpendicular to the longitudinal axis of the particle.

A cross-sectional plane in a direction parallel to the longitudinal axis, the plane including the longitudinal axis (corresponding to y-axis in FIG. 1), of the particulate sodium-potassium niobate having an octahedral shape is substantially line-symmetrical with respect to the longitudinal axis (a substantially rhombus shape) as shown in FIG. 1. Further, in FIG. 1, the length from the longitudinal axis to the outline of the particle (L3 in FIG. 1) decreases towards the end of the particle along the longitudinal axis.

Moreover, as shown in FIG. 2, a cross-section perpendicular to the longitudinal axis is in a cross shape.

It is not clear why the particles having such unique shapes are produced. As indicated by the SEM image shown in FIG. 6 or FIG. 8, the particles of the embodiments of the present invention are supposedly aggregates each formed of assembled finer particles (so called primary particles). The lattices in FIGS. 1 and 2 are intended to express the primary particles. Variation in the sodium and potassium ratio in the high-concentration alkaline solution may affect the crystalline conditions and the like during formation of aggregates from the primary particles. As a result, the particulate sodium-potassium niobate having novel shapes never known before is supposedly generated. The particles of the embodiments of the present invention can be provided when, for example, the Na:K ratio is 5:13, although the ratio is not particularly limited thereto.

The diameter of the primary particles in the embodiment of the present invention is about 10 to 500 nm. Since the particle of the embodiment of the present invention is an aggregate of the primary particles mentioned above, the maximum diameter is 3 to 20 μm, preferably 3 to 10 μm, and more preferably 3 to 5 μm, as is to be understood from the SEM image shown in FIG. 6. The particle length in the longitudinal axis direction within the above ranges is advantageous when applied to a fine-shape molded body or the like.

According to the embodiment of the present invention, the aspect ratio of the particle (L1/L2 in FIG. 1) is 1 to 5, preferably 1 to 3, and more preferably 1 to 2. Typical particles shown in FIG. 6 have an aspect ratio of 1 to 1.5.

Particulate sodium-potassium niobate having a substantially spheroidal shape (so-called rugby ball-like shape), which is another preferable embodiment of the present invention, will be described below with reference to the schematic diagrams shown in FIGS. 3 and 4, and the SEM image shown in FIG. 5.

As mentioned earlier, FIG. 3 illustrates a schematic diagram of a cross-section (cross-section in the xy-plane) parallel to the longitudinal axis of the particle. FIG. 4 illustrates a schematic diagram of a cross-section (cross-section in the xz-plane) perpendicular to the longitudinal axis of the particle. In FIG. 3, the meanings of L1, L2, and L3 are the same as those in FIG. 1.

Figure 3:
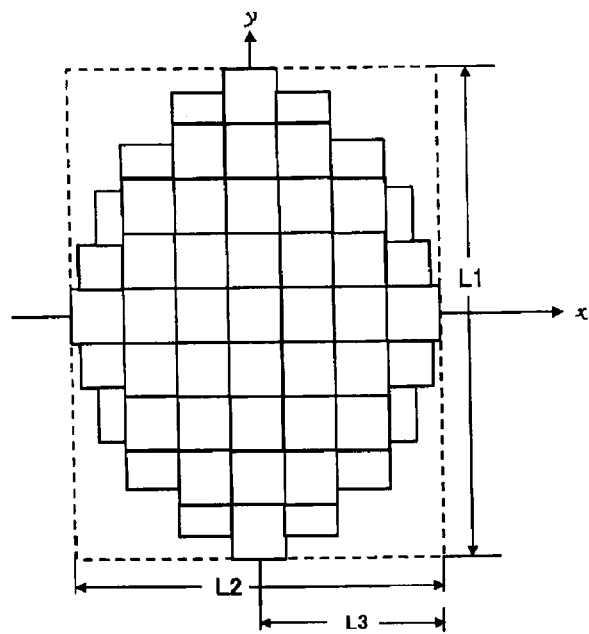
FIG. 3 illustrates a schematic diagram of a cross-section (cross-section in the xy-plane) parallel to the longitudinal axis of particulate sodium-potassium niobate which is a second aspect of the present invention.

A cross-sectional plane in a direction parallel to the longitudinal axis, the plane including the longitudinal axis (corresponding to y-axis in FIG. 1), of the particulate sodium-potassium niobate having an octahedral shape is substantially line-symmetrical with respect to the longitudinal axis (substantially elliptical shape) as shown in FIG. 3. Further, in FIG. 3, the length from the longitudinal axis to the outline of the particle (L3 in FIG. 1) decreases towards the end of the particle along the longitudinal axis.

Figure 4:
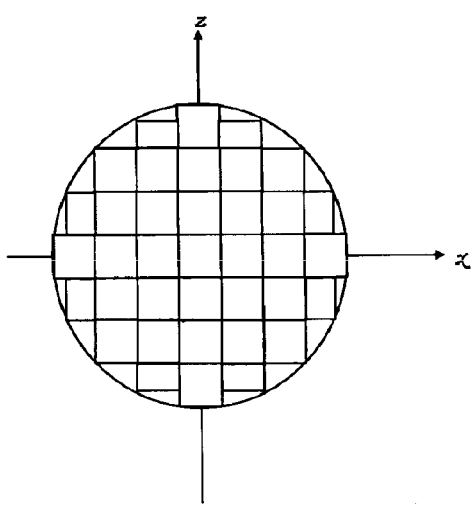
FIG. 4 illustrates a schematic diagram of a cross-section (cross-section in the xz-plane) cut perpendicular to the longitudinal axis of the particulate sodium-potassium niobate which is the second aspect of the present invention.

Moreover, as shown in FIG. 4, the cross-section perpendicular to the longitudinal axis is in a substantially circular shape. Namely, this particle has a shape filled with a larger amount of the primary particles than the particle having an octahedral shape.

As is understood from the SEM images shown in FIGS. 5 to 8, the maximum diameter of each of the particles according to the embodiment of the present invention is 0.05 to 20 μm, and preferably 3 to 10 μm. The particle length in the above ranges in the longitudinal axis direction is advantageous when applied to a fine-shape molded body or the like.

According to the embodiment of the present invention, the aspect ratio (L1/L2 in FIG. 3) of the particle is 1 to 5, preferably 1 to 3, and more preferably 1 to 2. A typical particle shown in the upper left in FIG. 5 has an aspect ratio of 1 to 1.5.

The method of preparing particulate sodium-potassium niobate is not particularly limited. The method described above, which is a first aspect of the present invention, is preferable as the method of preparing the particulate sodium-potassium niobate. The method is innovative in that the particle size can be controlled simply by chemical processes, and no physical processes such as grinding are necessary. Thus, the method is advantageous in that production processes can be simplified as compared to conventional methods. In addition, the method according to a first aspect of the present invention can control the size of particles, and prevent agglomeration of the particles, while it is generally difficult to control variation in particle size in physical grinding or the like conventional method. As a result, particles with highly-controlled size can be obtained by the method according to a first aspect of the present invention. Because of these reasons, the method of the first aspect of the present invention is preferable as the method for preparing particulate sodium-potassium niobate.

<Piezoelectric Ceramic Materials>

A third aspect of the present invention relates to a piezoelectric ceramic material including the particulate sodium-potassium niobate.

A method of producing the piezoelectric ceramic material is not particularly limited. Generally, the piezoelectric ceramic material may be produced by mixing dried particulate sodium-potassium niobate with required additives such as an organic binder, a dispersant, a plasticizer, and a solvent, to prepare a composition. Then, an article is molded from the composition through a known molding method, and the article is sintered at a high temperature (about 1,000° C.). Examples of such a known molding method include press molding and molding using a mold.

Then, by forming electrodes on a molded body obtained from the piezoelectric ceramic material, piezoelectric elements such as a piezoelectric buzzer and a piezoelectric transducer can be produced.

EXAMPLES

The present invention will be described in more detail based on the following examples. It is to be noted that the present invention is not limited to these examples. In the examples and comparative examples below, the unit "M", which is used to refer to a concentration of an alkali or acid solution, means mol/L unless otherwise indicated.

Example 1

Synthesis 1 of $Na_xK_{(1-x)}NbO_3$ Particles

A portion of 27.02 g (=100 mmol) of niobium chloride was completely dissolved in 150 mL of a 0.10-M aqueous HCl solution. The solution was transferred into a 200-mL volumetric flask, and a 0.10-M aqueous HCl solution was further added to the flask for adjusting the total volume of the solution to be 200 mL. A 0.50-M aqueous $NbCl_5$ solution in 0.10-M HCl was thus prepared. Then, 6.0 mL of the 0.50-M aqueous $NbCl_5$ solution in 0.10 M HCl was slowly added to 6.0 mL of a mixed solution of sodium hydroxide and potassium hydroxide (NaOH:KOH=6:12 (mol/mol)) having a total 18.0 M alkaline concentration in a 30-mL Teflon™ vessel at room temperature under stirring. The resulting white suspension was allowed to still stand with heating in the Teflon™ vessel for 24 hours at 100° C. Then, the content was transferred to an autoclave whose inner chamber wall was made of Teflon™, and allowed to stand for 3 hours with heating at 250° C. to perform hydrothermal reaction. The solid matter was separated from the resulting suspension by centrifugation, and then the solid was dispersed in water under ultrasonic dispersing. The solid matter was separated again by centrifugation and dried to separate particulate sodium-potassium niobate. The size and shape of the obtained solid particles were observed by a scanning electron microscope (SEM, manufactured by HITACHI, Ltd., S-4800), and the crystal structure of the solid particles was evaluated by X-ray diffraction (XRD, manufactured by Rigaku Corporation, Ultima-IV, 40 kV, 40 mA). The resulting particles had a unique rugby ball-like shape (FIG. 5).

Example 2

Particulate sodium-potassium niobate was obtained in the same manner as in Example 1, except that the molar ratio of the sodium hydroxide and potassium hydroxide (NaOH:KOH) in the mixed solution having a total 18.0-M alkaline concentration was changed to 5:13 (mol/mol). The resulting particles had a unique shape with a substantially octahedral structure (FIG. 6).

Example 3

Synthesis 2 of $Na_xK_{(1-x)}NbO_3$ Particles

An aqueous alkaline solution (6.0 mL) containing NaOH and KOH (the final NaOH concentration was 12 mol/L and the final KOH concentration was 24 mol/L in the aqueous alkaline solution) was added to 0.40 g (=3.0 mmol) of niobium pentoxide put in a 30-mL Teflon™ vessel. Ion-exchange water was further added to the vessel under stirring to adjust the total volume of the mixture to 12 mL. Then, the Teflon™ vessel was sealed and allowed to still stand with heating for 24 hours at 100° C. Then, the content was transferred to an autoclave whose inner chamber wall was made of Teflon™, and allowed to stand for 3 hours with heating at 250° C. to perform hydrothermal reaction. The solid matter was separated from the resulting suspension by centrifugation, and then the solid was dispersed in water under ultrasonic dispersing. The solid was separated again by centrifugation and dried to separate $NaNbO_3$ particles. Evaluation of the obtained particles was performed in the same manner as that described in Example 1. It is to be noted that, by adjusting the initial NaOH concentration, the initial KOH concentration, and the total alkaline concentration to 1 to 17 M, 17 to 1 M, and 18 M, respectively, $Na_xK_{(1-x)}NbO_3$ particles can be provided while the x in the $Na_xK_{(1-x)}NbO_3$ particles is controlled in a range of 0.05 to 0.8, and the particle diameter is controlled in a range of 0.5 to 30 μm. Moreover, $Na_xK_{(1-x)}NbO_3$ particles having unique shapes can be produced as well.

Example 4

Synthesis 3 of $Na_xK_{(1-x)}NbO_3$ Particles

Figure 7:
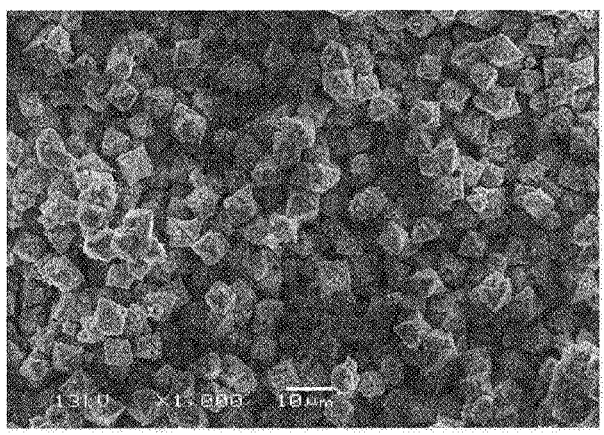
FIG. 7 shows a SEM image of $Na_xK_{(1-x)}NbO_3$ particles having an octahedral structure synthesized in Example 4.
Figure 8:
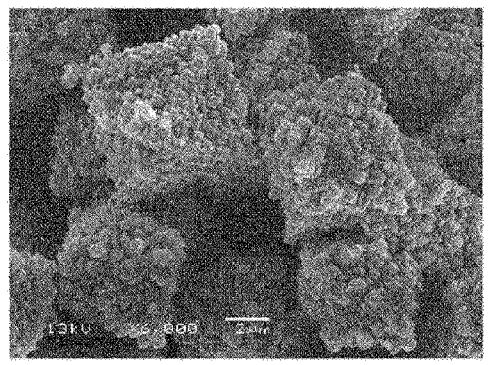
FIG. 8 is an enlarged view of FIG. 7.
Figure 9:
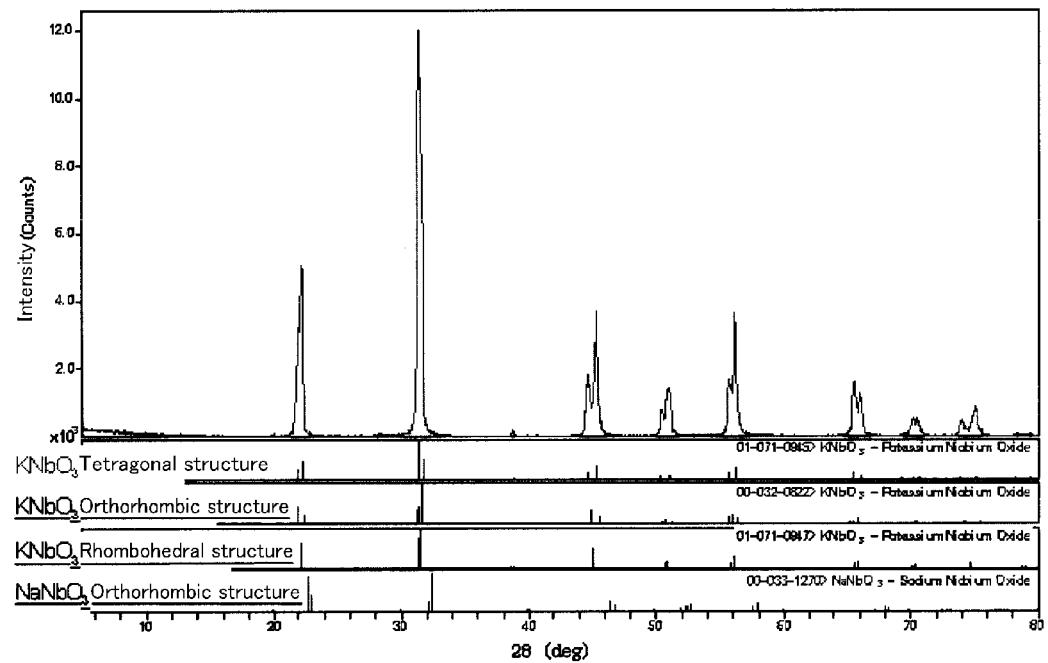
FIG. 9 shows an XRD pattern of $Na_xK_{(1-x)}NbO_3$ particles synthesized in Example 4.
Figure 10:
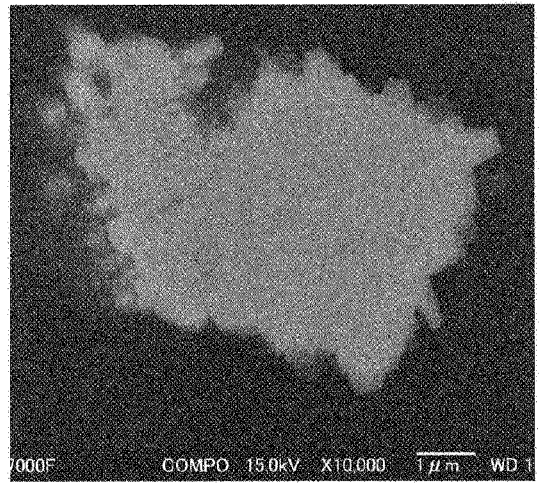
FIG. 10 shows a SEM image of a cross section of $Na_xK_{(1-x)}NbO_3$ particles synthesized in Example 4.
Figure 11:
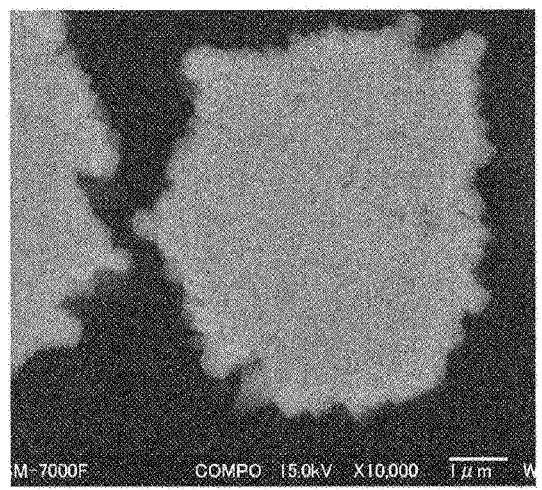
FIG. 11 shows a SEM image of a cross section of $Na_xK_{(1-x)}NbO_3$ particles synthesized in Example 4.
Figure 12:
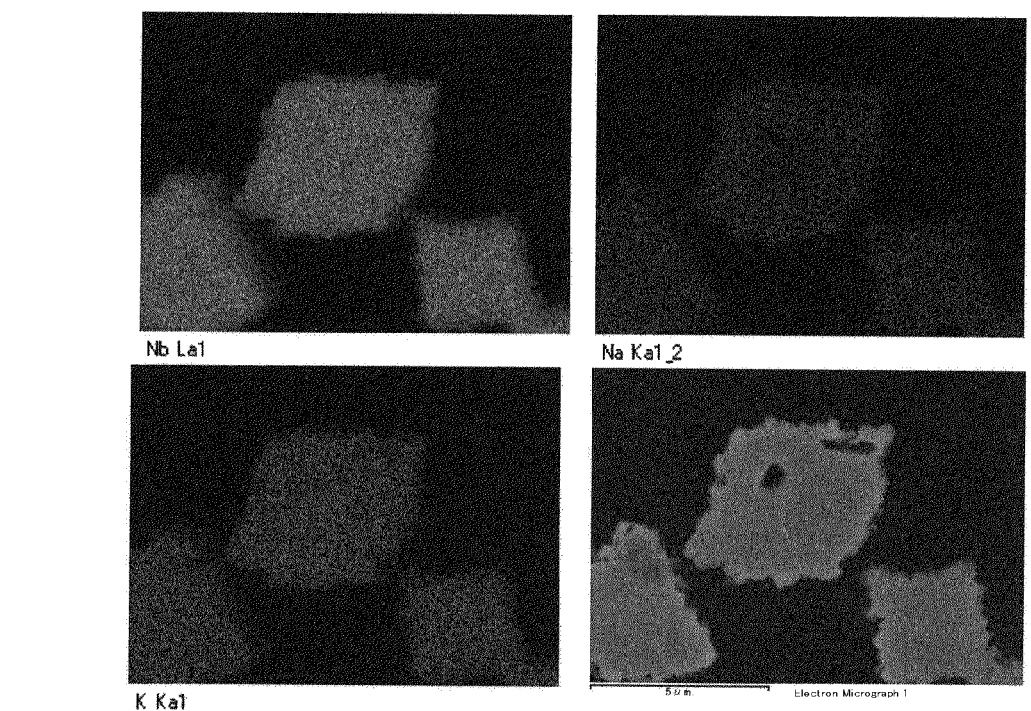
FIG. 12 shows results of EDS analysis on a cross section of $Na_xK_{(1-x)}NbO_3$ particles synthesized in Example 4.
Figure 12:
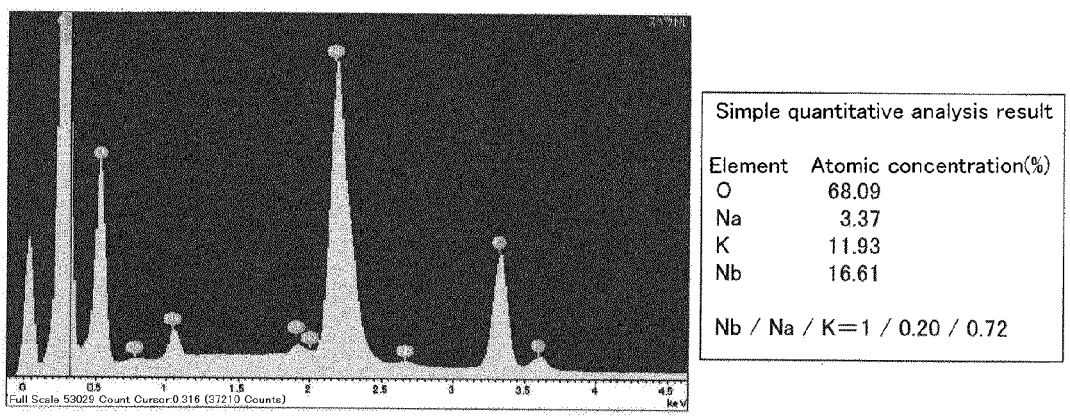
Figure 13:
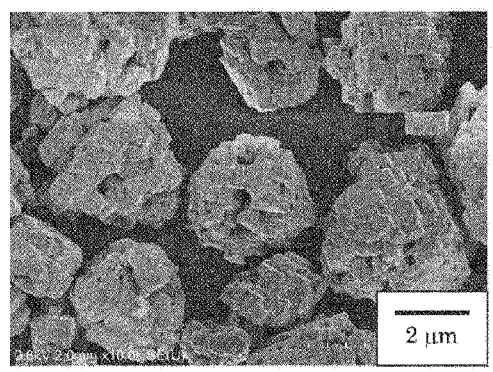
FIG. 13 shows a SEM image of particulate sodium-potassium niobate obtained when the ratio of Na:K was 4:14.
Figure 14:
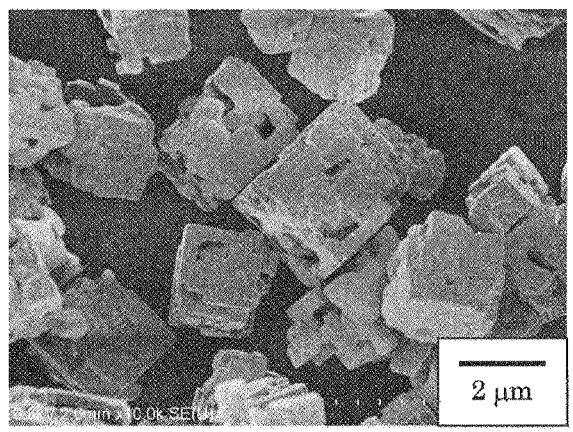
FIG. 14 shows a SEM image of particulate sodium-potassium niobate obtained when the ratio of Na:K was 3:15.
Figure 15:
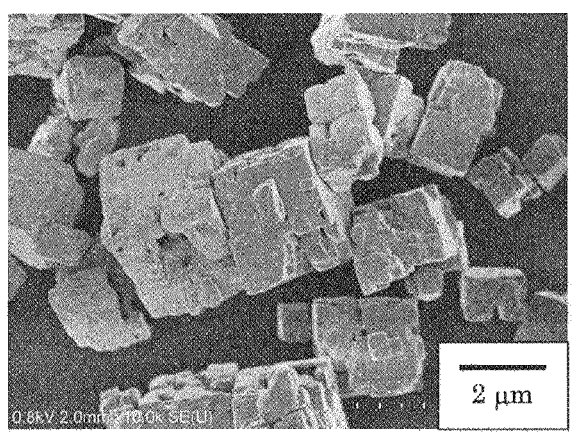
FIG. 15 shows a SEM image of particulate sodium-potassium niobate obtained when the ratio of Na:K was 2:16.
Figure 16:
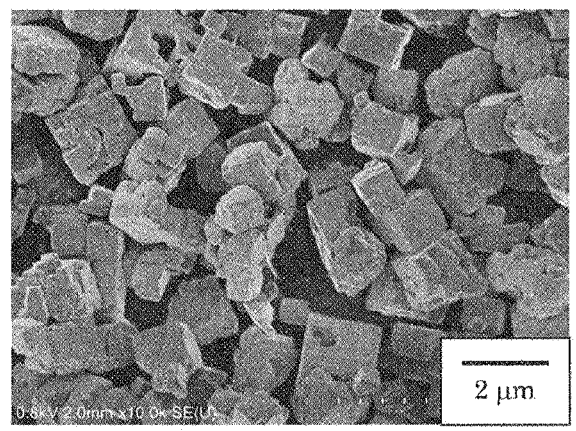
FIG. 16 shows a SEM image of particulate sodium-potassium niobate obtained when the ratio of Na:K was 1:17.

An aqueous alkaline solution (185 mL) containing NaOH and KOH (the final NaOH concentration was 12 mol/L and the final KOH concentration was 24 mol/L in the aqueous alkaline solution) was prepared in a Teflon™ beaker, and then stirred at room temperature. Niobium chloride in an amount of 25 g (=92.5 mmol) was added to 185 mL of a 0.10-M aqueous HCl solution to prepare a 0.50-M aqueous $NbCl_5$ solution in 0.10 M HCl. The resulting niobium chloride solution was added at a rate of 15 mL/min to the alkaline solution under stirring, and then stirred at room temperature for 10 minutes. The suspension thus obtained was transferred into an autoclave whose inner chamber wall made of Teflon™. The suspension was heated to 100° C. over 30 minutes under stirring, and was kept stirred at 100° C. for 24 hours. Thereafter, the suspension was heated to 200° C. over two and a half hours, followed by further heating at 200° C. for three hours under stirring to perform hydrothermal reaction. The heated suspension was cooled by natural cooling. The solid matter was separated from the resulting suspension by centrifugation. The collected solid matter was dispersed in water under ultrasonic dispersing, and separated by centrifugal segmentation. This washing process including ultrasonic dispersing and centrifugal segmentation was repeated six times. Washing by centrifugation was further made three times using acetone as a washing liquid, followed by drying in a desiccator. Thereby, particulate sodium-potassium niobate was obtained. The size and shape of the obtained solid particles were observed by a scanning electron microscope, and the crystal structure of the solid particles was evaluated by X-ray diffraction. FIGS. 7 and 8 show the SEM images, and FIG. 9 shows the results of the XRD analysis of the obtained particles. The results found that the particles were particles having a unique octahedral shape. The diffraction pattern indicated that the particles were tetragonal $KNbO_3$. Further, the condition inside the crystal and the elemental composition inside the particle were checked by cutting the particle with a cross-section polisher and performing EDS analysis thereon (FIGS. 10 to 12). It is to be noted that stirring on heating was effective to equalize particle shapes.

As shown in FIG. 12, sodium ion and potassium ion were uniformly incorporated inside the particle, which proved that $Na_xK_{(1-x)}NbO_3$ particles were obtained.

Examples 5 to 8

Particulate sodium-potassium niobate was obtained in the same manner as in Example 1, except that the NaOH: KOH molar ratio was changed to 4:14 (Example 5), 3:15 (Example 6), 2:16 (Example 7), and 1:17 (Example 8). The SEM images of the respective particles thus obtained were shown in FIGS. 13 to 16.

Comparative Example 1

Figure 17:
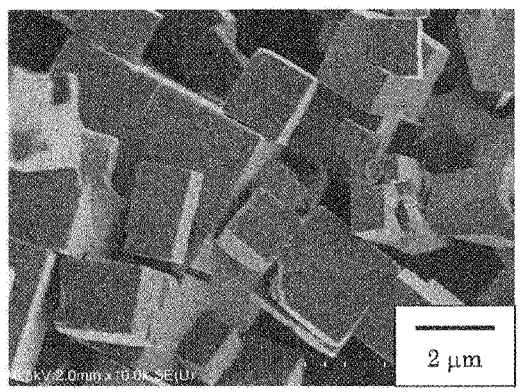
FIG. 17 shows a SEM image of particulate sodium niobate obtained when NaOH was used as an alkaline solution.

Particulate sodium niobate was obtained in the same manner as in Example 1, except that a 12.0-M aqueous NaOH solution (6.0 mL) was used as an alkaline solution. The resulting particles were fine particles having a substantially rectangular cuboid structure (FIG. 17).

Comparative Example 2

Figure 18:
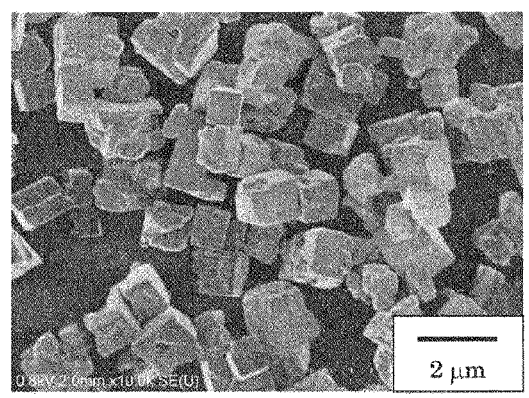
FIG. 18 shows a SEM image of particulate potassium niobate obtained when KOH is used as an alkaline solution.

Particle potassium niobate was obtained in the same manner as in Example 1, except that a 12.0-M aqueous KOH solution (6.0 mL) was used as an alkaline solution. The resulting particles were fine particles having a substantially rectangular cuboid structure (FIG. 18).

As is recognized by comparing the results of Comparative Examples 1 and 2 with the results of Examples, in the case where only NaOH or only KOH was used as an aqueous alkaline solution, the resulting particles were normally fine particles having a substantially rectangular cuboid structure. In contrast, in the case where NaOH and KOH were used in combination, the resulting particles had a unique, substantially octahedral shape, as shown, for example, in FIG. 7 and FIG. 8. It would be very difficult to expect based on the ordinary technical knowledge that the particles having such unique shapes can be obtained.

Example 9

Figure 19:
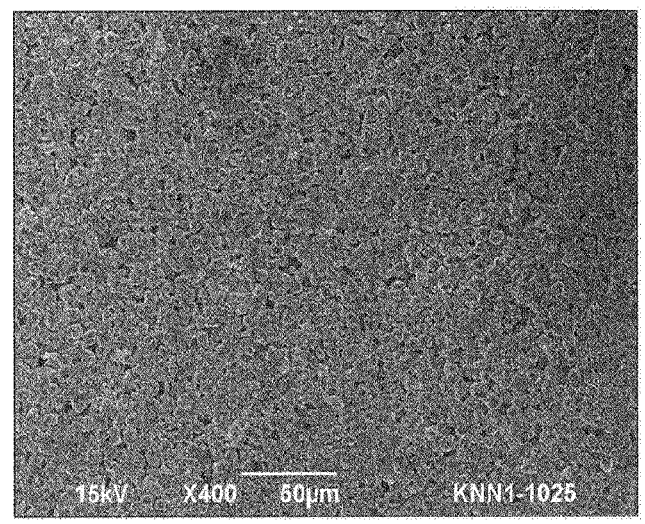
FIG. 19 shows a SEM image of a ceramic prepared from $Na_xK_{(1-x)}NbO_3$ particles having an octahedral structure synthesized in Example 9.
Figure 20:
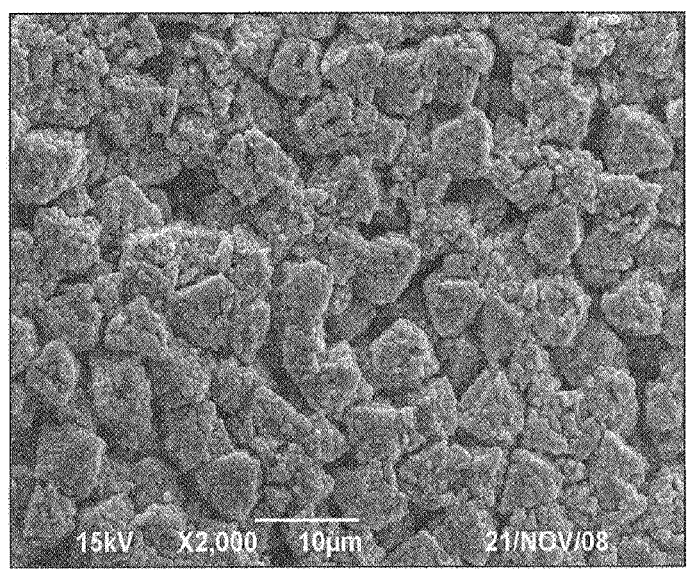
FIG. 20 is an enlarged view of FIG. 19.

Preparation of $Na_xK_{(1-x)}NbO_3$ Ceramics by Sintering and Evaluation of Piezoelectric Properties The $Na_xK_{(1-x)}NbO_3$ particles prepared in Example 4 were pelletized and then sintered at a temperature of 1,025° C. The piezoelectric properties of the obtained ceramics were evaluated. FIGS. 19 and 20 show the SEM images of the resulting sintered body, and Table 1 shows values of the properties.

In Table, the "kp" refers to an electromechanical coupling coefficient, which was calculated based on values of resonance frequency and antiresonance frequency measured with an impedance analyzer. The "$\epsilon_{33}^T/\epsilon_0$" refers to a dielectric constant measured with an impedance analyzer. The "Np" refers to frequency constant calculated based on values of resonance frequency measured with an impedance analyzer and element size. The "tan δ" refers to a dielectric loss measured with an impedance analyzer. The "d33" refers to a piezoelectric constant measured with a d33 meter.

TABLE 1

| kp (%) | $\epsilon_{33}^T/\epsilon_0$ | Np (Hz·m) | tan δ (%) | d33 (pC/N) |
|---|---|---|---|---|
| 24.1 | 445 | 2240 | 16.3 | 84 |

As shown in Table 1, the $Na_xK_{(1-x)}NbO_3$ ceramics obtained in the present invention have high piezoelectric properties, as $d_{33}$ of 84. Accordingly, the particulate sodium-potassium niobate of the present invention can be suitably used also as a piezoelectric material.

INDUSTRIAL APPLICABILITY

The production method of the present invention is a method to provide particulate sodium-potassium niobate having unique shapes directly only by chemical processes, which does not need any physical processes such as grinding. The particles thus obtained are micrometer-order-size particles having a highly uniform size and shape with excellent handleability, and such particles can be suitably used as a piezoelectric material.

EXPLANATION OF SYMBOLS

L1: Maximum diameter, or length of a long side of the circumscribed rectangle of the particle
L2: Length of a short side of the circumscribed rectangle of the particle
L3: Length from the longitudinal axis to the outline of the particle

The invention claimed is:
1. A method of producing a particulate sodium-potassium niobate represented by the formula (1):

$$Na_xK_{(1-x)}NbO_3 \quad (1),$$

comprising:
(a) mixing a niobium-containing solution with an alkaline solution having a concentration of 0.1 to 30 mol/L, to prepare a suspension;
(b) allowing the suspension to stand still for 12 to 48 hours at a temperature of between 80° C. and 150° C.;
(c) performing a solvothermal reaction of the suspension at a temperature of between 150° C. and 300° C. for 1 to 12 hours; and
(d) separating the particulate sodium-potassium niobate from a reaction mixture,
wherein the alkaline solution contains Na⁺ ion and K⁺ ion, and
wherein x is in a range of 0.05≤x≤0.8.
2. The method according to claim 1,
wherein a molar ratio between the Na⁺ ion and the K⁺ ion, Na:K, is from 1:17 to 17:1.

3. The method according to claim 1,
wherein the niobium-containing solution includes:
niobium oxide or niobium halide;
a solvent selected from the group consisting of water, ethylene glycol, and polyethylene glycol; and
an acid.
4. A particulate sodium-potassium niobate represented by the formula (1):

$$Na_xK_{(1-x)}NbO_3 \quad (1),$$

wherein x is in a range of 0.05≤x≤0.8,
wherein particles of the particulate sodium-potassium niobate have a maximum diameter of 0.05 to 20 μm and an aspect ratio of 1 to 5,
wherein a cross-sectional plane of the particles of the particulate sodium-potassium niobate parallel to the longitudinal axis and including the longitudinal axis has substantial line-symmetry with respect to the longitudinal axis,
wherein in the cross-sectional plane, a length from the longitudinal axis to an outline of the particles decreases from an end of the particles on the lateral axis towards an end of the particles on the longitudinal axis,
wherein the longitudinal axis is defined by the maximum diameter, and
wherein the maximum diameter is a straight line between two points on the outline of the particle where a distance between the two points is the longest, and
wherein the particulate sodium-potassium niobate is prepared by the method according to claim 1.
5. A particulate sodium-potassium niobate represented by the formula (1):

$$Na_xK_{(1-x)}NbO_3 \quad (1),$$

wherein x is in a range of 0.05≤x≤0.8,
wherein particles of the particulate sodium-potassium niobate have a maximum diameter of 0.05 to 20 μm and an aspect ratio of 1 to 5,
wherein a cross-sectional plane of the particles of the particulate sodium-potassium niobate parallel to the longitudinal axis and including the longitudinal axis has substantial line-symmetry with respect to the longitudinal axis,
wherein in the cross-sectional plane, a length from the longitudinal axis to an outline of the particles decreases from an end of the particles on the lateral axis towards an end of the particles on the longitudinal axis,
wherein the longitudinal axis is defined by the maximum diameter, and
wherein the maximum diameter is a straight line between two points on the outline of the particle where a distance between the two points is the longest.
6. The particulate sodium-potassium niobate according to claim 5,
wherein a cross-sectional plane of the particles perpendicular to the longitudinal axis has a cross shape.
7. The particulate sodium-potassium niobate according to claim 5,
wherein a cross-sectional plane of the particles perpendicular to the longitudinal axis has a substantially circular shape.
8. A piezoelectric ceramic material comprising the particulate sodium-potassium niobate according to claim 5.

* * * * *